United States Patent [19]

Ichikawa

[11] Patent Number: 4,726,320
[45] Date of Patent: Feb. 23, 1988

[54] LASER CVD DEVICE

[75] Inventor: Yukimi Ichikawa, Kanagawa, Japan

[73] Assignee: Fuji Electric Company, Ltd., Kawasaki, Japan

[21] Appl. No.: 844,590

[22] Filed: Mar. 27, 1986

[30] Foreign Application Priority Data

Mar. 29, 1985 [JP] Japan .................. 60-65945

[51] Int. Cl.⁴ .................... C23C 16/48
[52] U.S. Cl. .................... 118/722; 118/715
[58] Field of Search .......... 118/722, 723, 715

[56] References Cited

U.S. PATENT DOCUMENTS

| | | | |
|---|---|---|---|
| 4,048,953 | 9/1977 | Froberg | 118/722 |
| 4,065,369 | 12/1977 | Ogawa | 204/164 |
| 4,151,034 | 4/1979 | Yamamoto | 156/345 |
| 4,340,617 | 7/1982 | Deutsch | 427/53.1 |
| 4,595,570 | 6/1986 | Fukuta | 118/723 |

OTHER PUBLICATIONS

Andreatta, Appl. Phys. Lett., 40(2), Jan. 15, 1982, pp. 183–186.
Boyer, Appl. Phys. Lett., 40(8), Apr. 15, 1982, pp. 716–719.

Primary Examiner—Richard Bueker
Attorney, Agent, or Firm—Finnegan, Henderson, Farabow, Garrett, and Dunner

[57] ABSTRACT

In a laser CVD device, immediately before being emitted from a nozzle, raw gas in a reaction chamber reacts opto-chemically with a focused laser beam so that it is decomposed to form a radical flow. The radical flow flows against a substrate set in the reaction chamber so that active materials produced by the optochemical decomposition accumulate on the substrate to form a thin film thereon.

7 Claims, 6 Drawing Figures

LASER CVD DEVICE

FIELD OF THE INVENTION

This invention relates to a laser CVD device in which a raw gas is decomposed by optical decomposition with a laser beam to form a radical, and the radical thus formed is accumulated on a substrate to form a thin film thereon.

BACKGROUND OF THE INVENTION

A conventional laser CVD device of this type is as shown in FIGS. 2 and 3. In the device, an ultraviolet laser 1, such as an excimer laser is employed as a light source, and its laser beam 2 is directed into a reaction chamber 4 through a window 3. A substrate 6 is mounted on a susceptor 5 in the reaction chamber 4, and is heated to a required temperature by a heater 7. In forming a silicon film, a gas mixture prepared by mixing a base gas, namely, silane gas ($SiH_4$ or $Si_2H_6$) with a diluting gas (rare gas or $H_2$) is employed as a raw gas when forming a nitride film and an oxide film. When forming a nitrogen film and an oxygen film, the gas mixture is prepared by mixing the base gas with nitrogen gas and oxygen gas as raw gases.

The raw gas is introduced into the reaction chamber 4 which has been evacuated through the discharge outlet 9. The raw gas thus introduced reacts opto-chemically with the laser beam 2, to form the radical. The radical accumulates on the substrate 6 to form a thin film. In this operation, the laser beam may be applied directly to the substrate as shown in FIG. 2, or it may indirectly illuminate the substrate as shown in FIG. 3.

As is apparent from the above description, in the conventional device, the laser beam passes through only a part of the space in the reaction chamber, and therefore the efficiency of formation of the radical is low. Furthermore, in the case where a plurality of raw gases are provided, it is rather difficult to use them selectively. That is, in forming an alloy film by using a plurality of raw gases, it is difficult to control the composition ratio of them over a wide range.

SUMMARY OF THE INVENTION

Accordingly, an object of this invention is to provide a laser CVD device in which the above-described difficulties accompanying a conventional laser CVD device have been eliminated, and the laser's features of high intensity and high directivity are fully utilized.

The foregoing object and other objects of the present invention have been achieved by the provision of a laser CVD device comprising a reaction chamber, a substrate supporting member disposed in the reaction chamber a raw gas introducing pipe extending into the reaction chamber and having a nozzle emitting the raw gas towards the substrate supporting member, a laser beam source provided outside the reaction chamber; and an optical system for focusing a laser beam from the laser beam source on the flow of raw gas from the nozzle in such a manner that the laser beam is applied perpendicularly to the flow of raw gas near the nozzle.

BRIEF DESCRIPTION OF THE DRAWINGS

The nature, principle and utility of the present invention will become fully apparent from the following detailed description when read in conjunction with the accompanying drawings, wherein.

DETAILED DESCRIPTION OF THE INVENTION

Figure 1:
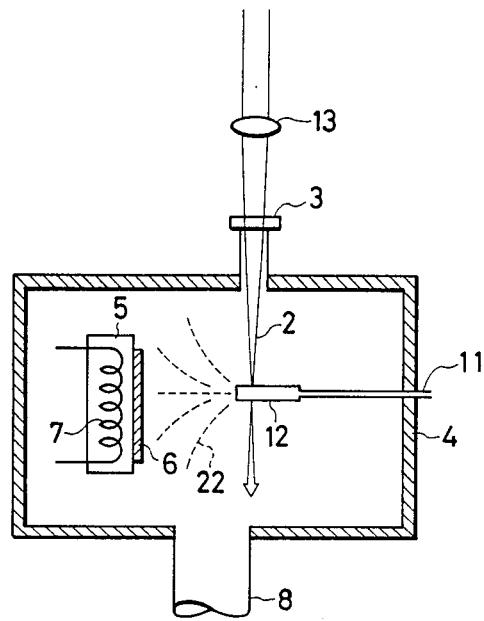
FIG. 1 is a sectional view showing a first example of a laser CVD device according to the present invention.
Figure 2:
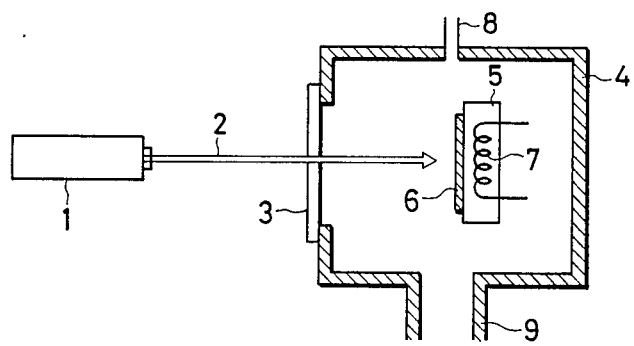
FIGS. 2 and 3 are sectional views of a conventional laser CVD device, showing two different ways of applying a laser beam to a substrate.
Figure 3:
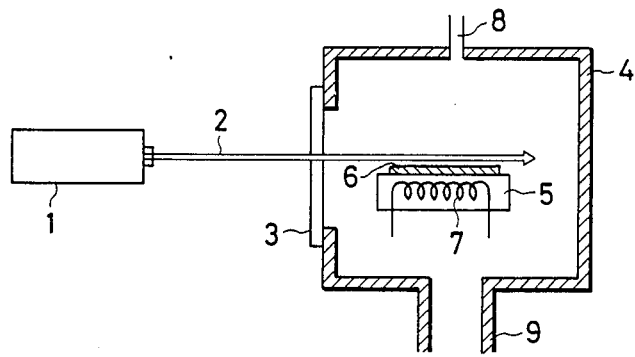

A first example of a laser CVD device according to the present invention is as shown in FIG. 1, in which those components which have been described with reference to FIGS. 2 and 3 are designated by the same reference numerals.

As in the conventional laser CVD device, a susceptor 5 is provided in a reaction chamber 4, and a substrate 6 is mounted on the susceptor 5. The substrate 6 can be heated to a desired temperature with a heater 7. A raw gas introducing pipe 11 protrudes into the reaction chamber 4 from outside, and a nozzle 12 is connected to the end of the raw gas introducing pipe 11 so as to emit a stream of raw gas towards the substrate 6. A laser beam 2 from a light source is applied through a window 3 to the nozzle 12. More specifically, the laser beam is focused on the end of the nozzle 12 by means of a lens 13. The reaction chamber 4 is evacuated through a discharge outlet with a high power vacuum pump so that the gas stream emitted by the nozzle 12 flows in a free expansion mode as indicated at 22.

Figure 4:
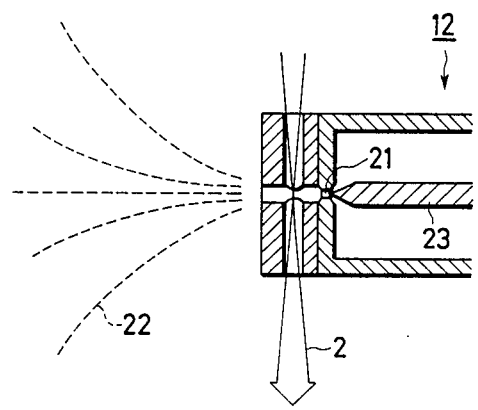
FIG. 4 is a sectional view of one example of a nozzle employed in the laser CVD device of the present invention.

FIG. 4 is a sectional view showing one example of a nozzle 12 for forming a radical flow. In FIG. 4, the raw gas supplied through an orifice 21 reacts opto-chemically with the laser beam 2 to form radicals, thus providing a radical flow 22. The orifice 21 is so designed that it is opened and closed by a needle valve 23 in synchronization with laser pulses. In the case where an ultraviolet laser such as an ArF excimer laser is employed as the laser beam source, a typical pulse rate is several tens of pulses per second. The valve is opened in synchronization with the pulse rate, and the valve opening time is made as short as possible.

The radical flow 22 thus formed flows against the substrate 6, to form a thin film thereon. Means for moving the substrate 6 in a scanning manner with respect to the nozzle 12 may be provided to facilitate the formation of a uniform thin film on a large substrate.

Figure 5:
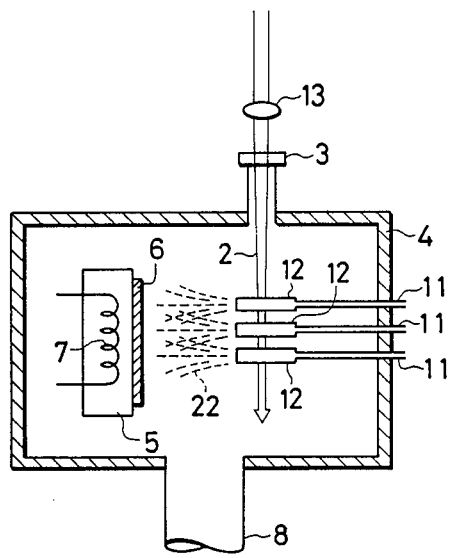
FIG. 5 is a sectional view of a second example of the laser CVD device according to the present invention.

FIG. 5 shows a second example of the laser CVD device according to the present invention. The device in FIG. 5 is different from that in FIG. 1 in that a plurality of nozzles 12 for emitting raw gas are provided in the reaction chamber 4, and the laser beam 2 passes through each of the nozzles 12. In the device of FIG. 5, the laser beam can be even more effectively utilized. Furthermore, it is possible to form a thin film on a large substrate by supplying the same raw gas to each of the plurality of nozzles, and to form an alloy film on a substrate by supplying different raw gases to different ones of the plurality of nozzles.

Figure 6:
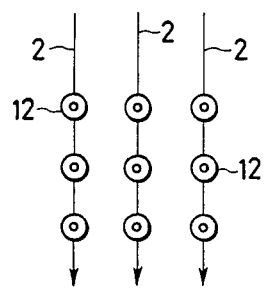
FIG. 6 is a front view of the nozzles in a third embodiment of the laser CVD device according to the present invention.

The above-described laser CVD device can be modified as shown in FIG. 6. A plurality of lasers can be employed, or a plurality of laser beams can be obtained by applying one laser beam to a beam splitter. The beams are sent to the nozzles 12 arranged in a matrix form. In this case, a uniform film can be formed on a large substrate.

As is apparent from the above description, in the laser CVD device according to the present invention, the raw gas is emitted towards the substrate by the nozzle in the reaction chamber. In this operation, a flow of raw gas is formed by the nozzle and the laser beam is focused on the flow of raw gas thus formed, so that the raw gas is subjected to opto-chemical reaction. Since substantially all of the raw gas supplied into the reaction chamber is irradiated by the laser beam, the raw gas and the laser beam are utilized with high efficiency.

Furthermore, in the example of the device according to the present invention which employs a plurality of nozzles to emit a plurality of different raw gases in the reaction chamber, as was described above, an alloy film can be readily achieved with a high degree of control over the composition ratio of these components.

It should be understood that the present invention is not limited to the particular embodiments described, but rather is susceptible to further modifications, alterations, and equivalent arrangements within the scope of the appended claims.

What is claimed is:

1. A laser CVD device comprising:
a reaction chamber;
a substrate supporting member provided in said reaction chamber;
a raw gas introducing pipe extending into said reaction chamber and having a nozzle connected thereto with an orifice at one end for emitting a flow of raw gas towards said substrate supporting member;
a laser beam source provided outside said reaction chamber; and
an optical system for focusing a laser beam from said laser beam source on said one end of the nozzle for irradiating substantially all of the raw gas emitted into the reaction chamber through said orifice from said nozzle.

2. A device according to claim 1, wherein said reaction chamber includes a window for admitting said laser beam into said chamber such that the direction of said beam is substantially perpendicular to said flow of raw gas.

3. A device according to claim 2, wherein said optical system includes a lens.

4. A device according to claim 2, wherein said raw gas introducing pipe has a plurality of nozzles connected thereto for emitting streams of raw gas toward said substrate supporting member.

5. A device according to claim 4, wherein said plurality of nozzles is arranged in a matrix of rows and columns.

6. A device according to claim 5, wherein said laser beam source includes means for producing a plurality of beams, and wherein said optical system focuses each of said beams on said one end of each of said plurality of nozzles in the same row in said matrix.

7. A device according to claim 1, wherein said laser beam source produces laser beam pulses to be focused on said flow of raw gas emitted from said nozzle, and wherein said nozzle includes a valve means for opening and closing said orifice of said nozzle to emit a pulse of said gas therefrom in synchronization with said pulses of said laser beam.

* * * * *